United States Patent
Kuo

(10) Patent No.: US 8,735,913 B2
(45) Date of Patent: May 27, 2014

(54) LIGHT EMITTING SEMICONDUCTOR STRUCTURE

(75) Inventor: Wu-Cheng Kuo, Hsinchu (TW)

(73) Assignees: VisEra Technologies Company Limited, Hsin-Chu (TW); SemiLEDS Optoelectronics Co., Ltd., Chu-Nan, Miao-Li County (TW)

(*) Notice: Subject to any disclaimer, the term of this patent is extended or adjusted under 35 U.S.C. 154(b) by 128 days.

(21) Appl. No.: 13/078,541

(22) Filed: Apr. 1, 2011

(65) Prior Publication Data
US 2012/0248473 A1    Oct. 4, 2012

(51) Int. Cl.
*H01L 33/00* (2010.01)

(52) U.S. Cl.
USPC ............ 257/89; 257/91; 257/99; 257/777; 257/E33.012; 257/E23.085

(58) Field of Classification Search
USPC ......... 257/89, 91, 99, 777, E33.012, E23.085
See application file for complete search history.

(56) References Cited

U.S. PATENT DOCUMENTS

| | | | |
|---|---|---|---|
| 6,730,937 B2* | 5/2004 | Dai et al. | 257/89 |
| 7,005,667 B2 | 2/2006 | Chen et al. | |
| 8,017,955 B2* | 9/2011 | Wang et al. | 257/89 |
| 8,089,079 B2* | 1/2012 | Lee | 257/89 |
| 2002/0079834 A1* | 6/2002 | Dai et al. | 313/506 |
| 2002/0167015 A1 | 11/2002 | Okazaki | |
| 2003/0227023 A1* | 12/2003 | Chang et al. | 257/89 |
| 2004/0129944 A1* | 7/2004 | Chen | 257/89 |
| 2005/0093427 A1* | 5/2005 | Wang et al. | 313/498 |
| 2007/0284566 A1* | 12/2007 | Tada et al. | 257/13 |
| 2008/0116470 A1* | 5/2008 | Nishimura | 257/89 |
| 2009/0001392 A1* | 1/2009 | Lee | 257/89 |
| 2010/0109028 A1* | 5/2010 | Chen et al. | 257/91 |
| 2011/0058369 A1 | 3/2011 | Imamura et al. | |

FOREIGN PATENT DOCUMENTS

| | | |
|---|---|---|
| CN | 101438408 | 5/2009 |
| TW | 200608596 | 3/2006 |
| TW | 201017925 | 5/2010 |

* cited by examiner

*Primary Examiner* — Tu-Tu Ho
(74) *Attorney, Agent, or Firm* — Muncy, Geissler, Olds & Lowe, P.C.

(57) ABSTRACT

The invention provides a light emitting semiconductor structure, which includes a substrate; a first LED chip formed on the substrate; an adhesion layer formed on the first LED chip; and a second light emitting diode chip formed on the adhesion layer, wherein the second LED chip has a first conductive wire which is electrically connected to the substrate.

7 Claims, 4 Drawing Sheets ns of a light emitting semiconductor structure in accordance with a fourth embodiment of the invention; and FIG. 5 shows a cross-sectional schematic representation of a light emitting semiconductor structure in accordance with a fifth embodiment of the invention.

LIGHT EMITTING SEMICONDUCTOR STRUCTURE

BACKGROUND OF THE INVENTION

1. Field of the Invention

The present invention relates to a light emitting semiconductor structure and in particular relates to a light emitting semiconductor structure with at least two LED chips.

2. Description of the Related Art

Because light emitting semiconductor structure have several advantages over conventional lamps, such as a long lifetime, a small size, low power consumption, high response speed, etc., considerable research attention has been recently focused on development thereof.

Conventionally, one way to generate a white light emitting semicondcutor structure is to coat or fill a yellow phosphor on a blue LED chip. The blue light emitted by the LED chip is then mixed with the complimentary yellow light from phosphor to generate white light.

The other way to generate a white light emitting semiconductor structure is to mix different colors emitted from a plurality of the LEDs to produce a white light emitting diode. U.S. Pat. No. 7,005,667 discloses a light emitting diode, wherein a blue LED chip is arranged parallel to a blue-complimentary LED chip (such as yellow LED chip) to generate white light. However, two LEDs are arranged in the same plane and thus occupy too much area. Therefore, the package size of the light emitting semiconductor structure can not be reduced.

Therefore, there is a need to develop a light emitting semiconductor structure which has a small package size to simplify the design of the secondary optical lens in the subsequent steps.

BRIEF SUMMARY OF THE INVENTION

The present invention provides a light emitting semiconductor structure, comprising: a substrate; a first LED chip formed on the substrate; an adhesion layer formed on the first LED chip; and a second light emitting diode chip formed on the adhesion layer, wherein the second LED chip has a first conductive wire which is electrically connected to the substrate A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following descriptions of FIG. 1 to FIG. 5 are used to describe a light emitting semiconductor structure of the invention. The drawings are idealized representations for better illustration of the structure of the invention, and various elements are not necessarily shown to scale.

Figure 1A:
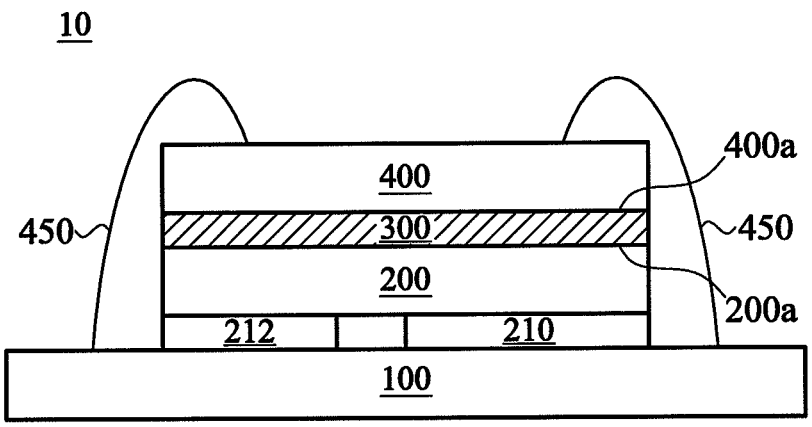
FIG. 1A to 1B show cross-sectional schematic representations of a light emitting semiconductor structure in accordance with embodiments of the invention.

FIG. 1A shows a cross-sectional schematic representation of an embodiment of a light emitting semiconductor structure 10. The light emitting semiconductor structure 10 comprises two light emitting diode chips which are vertically stacked and emit different colors of light to produce a white light.

The light emitting semiconductor structure 10 comprises a substrate 100, a first LED chip 200, an adhesion layer 300 and a second LED chip 400, wherein the first LED chip 200 is formed on the substrate 100, the adhesion layer 300 is formed on the first LED chip 200, and the second LED chip 400 is formed on the adhesion layer 300. The second LED chip 400 has a first conductive wire 450 which is electrically connected to the substrate 100.

The material of the substrate 100 comprises silicon substrate, ceramic substrate or lead frame. The first LED chip 200 or the second LED chip 400 comprises a sub-substrate, an N-type conductive layer, an active layer and a P-type conductive layer. The adhesion layer 300, such as transparent adhesive glue, is used to combine the first LED chip 200 and the second LED chip 400 together. The first LED chip 200 comprises a first pad 210 and a second pad 212 which are electrically connected to the substrate 100. Additionally, a connective layout (not shown) is formed between the substrate 100 and the firs pad 210 and second pad 212, and the conductive layout may be a conventional adhesive or metal bump (such as solder, gold or aluminum bumps).

Figure 1B:
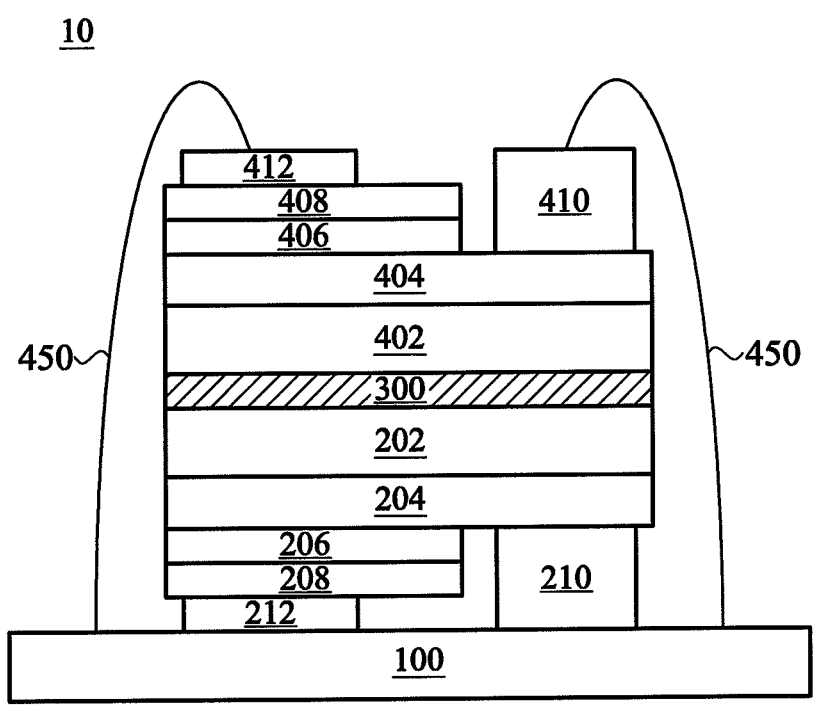

FIG. 1B shows a detailed schematic representation of the light emitting semiconductor structure 10 of FIG. 1A. A first conductive type semiconductor layer 204, an active layer 206 and a second conductive type semiconductor layer 208 are in sequence formed on a sub-substrate 202. The first pad 210 is formed on the first conductive type semiconductor layer 204, and the second pad 212 is formed on the second conductive type semiconductor layer 208.

The first conductive type semiconductor layer 204 or the second conductive type semiconductor layer 208 are made of a III-V compound semiconductor. In one embodiment, the first conductive type semiconductor layer 204 is an N-type nitride, and the second conductive type semiconductor layer 208 is a P-type nitride. In another embodiment, the first conductive type semiconductor layer 204 is a P-type nitride, and the second conductive type semiconductor layer 208 is an N-type nitride. The first conductive type semiconductor layer 204 may optionally be doped with silicon (Si) and the second conductive type semiconductor layer 208 may optionally be doped with zinc (Zn) or magnesium (Mg).

Likewise, a first conductive type semiconductor layer 404, an active layer 406 and a second conductive type semiconductor layer 408 are in sequence formed on a sub-substrate 402. The third pad 410 is formed on the first conductive type semiconductor layer 404, and the fourth pad 412 is formed on the second conductive type semiconductor layer 408.

In FIG. 1A, the first LED chip 200 is electrically connected to the substrate 100 by a flip-chip method, and more specifically, the first LED chip 200 is electrically connected to the substrate 100 by the first pad 210 and the second pad 212. The second LED chip 400 is electrically connected to the substrate 100 by a wire bonding method, and more specifically, the second LED chip 400 is electrically connected to the substrate 100 by the third pad 410 and the fourth pad 414 through the first conductive wire 450.

The first LED chip 200 and the second LED chip 400 may be electrically connected in parallel or in series with each other. In one embodiment, the first LED chip 200 has a P-type first pad 210P and an N-type second pad 212N, and the second LED chip 400 has a P-type third pad 410P and an N-type fourth pad 412N, and the P-type first pad 210P is electrically connected to the P-type third pad 410P by an electrical interconnection built on the substrate and the N-type second pad 212N is electrically connected to the N-type fourth pad 412N by another electrical interconnection built on the substrate. Thus, the first LED chip 200 and the second LED chip 400 are electrically connected in parallel with each other.

In another embodiment, the first LED chip 200 has a P-type first pad 210P and an N-type second pad 212N, and the second LED chip 400 has an N-type third pad 410N and a P-type fourth pad 412P, and the P type first pad 210P is electrically connected to the N-type third pad 410N by an electrical interconnection built on the substrate and the N-type second pad 212N is electrically connected to the P-type fourth pad 412P by another electrical interconnection built on the substrate. Thus, the first LED chip 200 and the second LED chip 400 are electrically connected in series with each other.

Note that in FIG. 1 the first LED chip 200 and the second LED chip 400 are combined by the adhesion layer 300. Thus, the first LED chip 200 and the second LED chip 400 are insulated from each other by the adhesion layer 300. More specifically, the first LED chip 200 has a first surface 200a contacting the adhesion layer 300, the second LED chip 400 has a second surface 400a contacting the adhesion layer 300, and the first surface 200a is insulated from the second surface 400a by the adhesion layer 300. In other words, there is no electrical connection between the first surface 200a and the second surface 400a. Because the first surface 200a is insulated from the second surface 400a, the electrical connection relationship between the first LED chip 200 and the second LED chip 400 depends on the electrical interconnections built on the substrate.

In one embodiment, the first LED chip 200 emits blue light and the second LED chip 400 emits yellow light. The blue light is mixed with the yellow light to generate white light. In another embodiment, the first LED chip 200 emits yellow light and the second LED chip 400 emits blue light.

Figure 2:
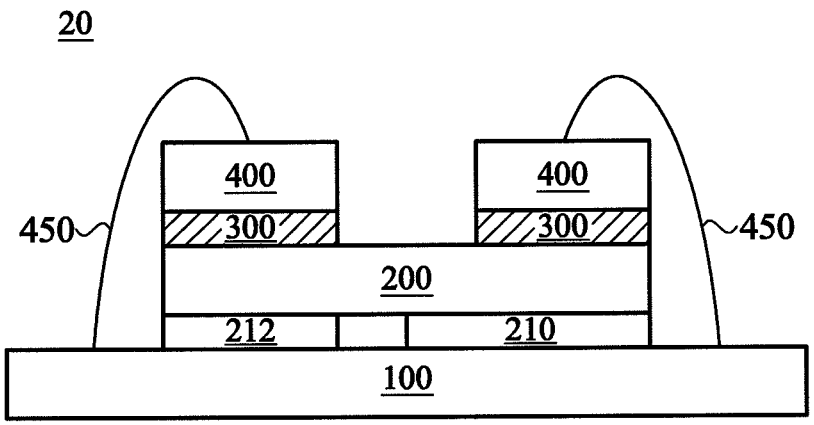
FIG. 2 shows a cross-sectional schematic representation of a light emitting semiconductor structure in accordance with a second embodiment of the invention.

FIG. 2 shows a cross-sectional schematic representation of a second embodiment of a light emitting semiconductor structure 20, wherein like elements are identified by the same reference numbers as in FIG. 1A, and are thus omitted for clarity. The difference between FIG. 2 and FIG. 1A is that a plurality of second LED chips 400 shown in FIG. 2. In FIG. 2, there are at least two second LED chips 400 formed on the adhesion layer 300, and thus a size of these second LED chips 400 is smaller than a size the first LED chip 200. The advantage of the second embodiment is that these second LED chips 400 may be arranged in any shape, such as circular, triangular, rectangular, or irregular shapes (from a top view of the LED 20, not shown in the Figure), depending on actual application needs.

Figure 3:
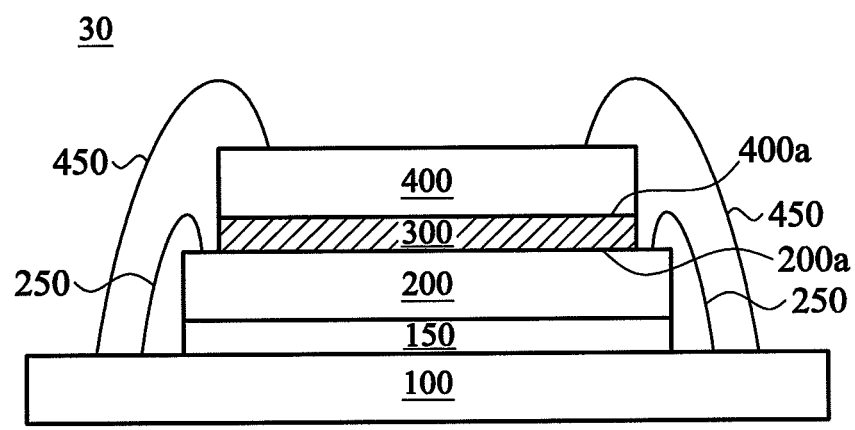
FIG. 3 shows a cross-sectional schematic representation of a light emitting semiconductor structure in accordance with a third embodiment of the invention.

FIG. 3 shows a cross-sectional schematic representation of a third embodiment of a light emitting semiconductor structure 30, wherein like elements are identified by the same reference numbers as in FIG. 1A, and are thus omitted for clarity. The difference between FIG. 3 and FIG. 1A is that the first LED chips 200 is electrically connected to the substrate 100 by a wire bonding method in FIG. 3. As shown in FIG. 3, a silver glue 150 is formed on the substrate 100 and the first LED chip 200 is formed on the silver glue 150. Additionally, the first LED chip 200 has a second conductive wire 250 which is electrically connected to the substrate 100. Note that the first LED chip 200 has the second conductive wire 250 which occupies some surface areas of the first LED chip 200, and thus a size of the second LED chip 400 is smaller than a size the first LED chip 200.

Note that in the third embodiment, the first LED chip 200 and the second LED chip 400 are combined by the adhesion layer 300. Thus, the first LED chip 200 and the second LED chip 400 are insulated from each other by the adhesion layer 300. More specifically, the first LED chip 200 has a first surface 200a contacting the adhesion layer 300, the second LED chip 400 has a second surface 400a contacting the adhesion layer 300, and the first surface 200a is insulated from the second surface 400a by the adhesion layer 300. In other words, there is no electrical connection between the first surface 200a and the second surface 400a. Because the first surface 200a is insulated from the second surface 400a, the electrical connection relationship of the first LED chip 200 and the second LED chip 400 depends on the electrical interconnections built on the substrate.

Figure 4A:
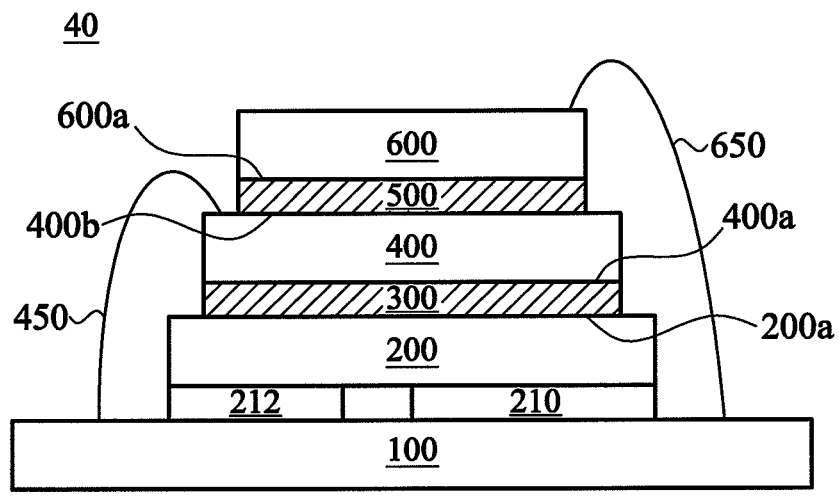
FIG. 4A to 4B show cross-sectional schematic representations of a light emitting semiconductor structure in accordance with a fourth embodiment of the invention.

FIG. 4A shows a cross-sectional schematic representation of a fourth embodiment of a light emitting semiconductor structure 40, wherein like elements are identified by the same reference numbers as in FIG. 1A, and are thus omitted for clarity. The difference between FIG. 4A and FIG. 1A is that an additional third LED chip 600 is shown in FIG. 4A. A second adhesion layer 500 is formed on the second LED chip 400, and a third LED chip 600 is formed on the second adhesion layer 500. Furthermore, the third LED chip 600 has a third conductive wire 650 which is electrically connected to the substrate 100 by a wire bonding method.

Note that the advantage of the third embodiment is that several monochromatic colors emitted by the LED chips 200, 400, and 600 are mixed to improve the color rendering index (CRI) of the LED 40.

Additionally, in FIG. 4A the second LED chip 400 and the third LED chip 600 are combined by the second adhesion layer 500. Thus, the second LED chip 400 and the third LED chip 600 are insulated from each other by the second adhesion layer 500. More specifically, the second LED chip 400 has a third surface 400b contacting the second adhesion layer 500, the third LED chip 600 has a fourth surface 600a contacting the second adhesion layer 500, and the third surface 400b is insulated from the fourth surface 600a by the second adhesion layer 500. In other words, there is no electrical connection between the third surface 400b and the fourth surface 600a.

In one embodiment, the first LED chip 200, the second LED chip 400 and the third LED chip 600 emit three different colors of light. The three different colors of light comprise blue light, green light and red light. Thus, there are six permutations. In one embodiment, the first LED chip 200 emits blue light, the second LED chip 400 emits green light and the third LED chip 600 emits red light. In another embodiment, the first LED chip 200 emits green light, the second LED chip 400 emits blue light and the third LED chip 600 emits red light. In yet another embodiment, the first LED chip 200 emits red light, the second LED chip 400 emits green light and the third LED chip 600 emits blue light. In one embodiment, the first LED chip 200 emits green light, the second LED chip 400 emits red light and the third LED chip 600 emits blue light.

In another embodiment, the first LED chip 200, the second LED chip 400 and the third LED chip 600 emit three different colors of light. The three different colors of light comprise blue light, yellow light and red light. Thus, there are six permutations. In one embodiment, the first LED chip 200 emits blue light, the second LED chip 400 emits yellow light and the third LED chip 600 emits red light. In another embodiment, the first LED chip 200 emits yellow light, the second LED chip 400 emits blue light and the third LED chip 600 emits red light. In yet another embodiment, the first LED chip 200 emits red light, the second LED chip 400 emits yellow light and the third LED chip 600 emits blue light. In one embodiment, the first LED chip 200 emits blue light, the second LED chip 400 emits red light and the third LED chip 600 emits yellow light.

Figure 4B:
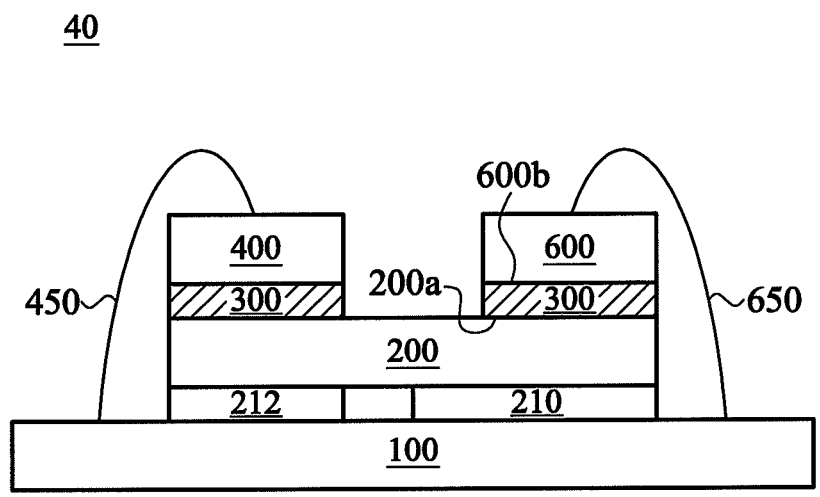

FIG. 4B shows a modified fourth embodiment of the light emitting semiconductor structure 40, wherein the third LED chip 600 is formed on the adhesion layer 300 rather than the second adhesion layer 500. In other words, the third LED chip 600 is formed on the first LED chip 200. Likewise, the third LED chip 600 has a third conductive wire 650 which is electrically connected to the substrate 100 by a wire bonding method. More specifically, the first LED chip 200 has a first surface 200a contacting the adhesion layer 300, the third LED chip 600 has a fifth surface 600b contacting the adhesion layer 300, and the first surface 200a is insulated from the fifth surface 600b by the adhesion layer 300.

Figure 5:
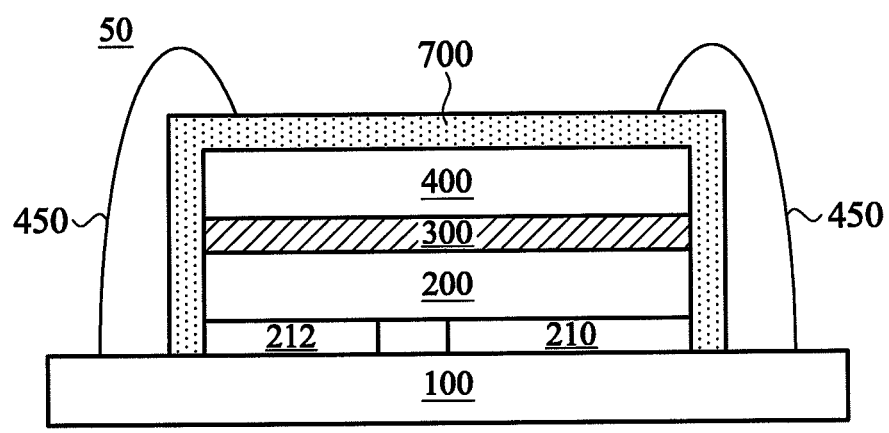

FIG. 5 shows a cross-sectional schematic representation of a fifth embodiment of a light emitting semiconductor structure 50, wherein like elements are identified by the same reference numbers as in FIG. 1A, and are thus omitted for clarity. The difference between FIG. 5 and FIG. 1A is that an additional phosphor 700 is coated on the first LED chip 200 and the second LED chip 400. A white light is generated by mixing at least two LED chips 200, and 400 and the phosphor 700.

In one embodiment, one of the first LED chip 200 or the second LED chip 400 emits blue light, the other emits red light, and the phosphor 700 emits yellow light.

In another embodiment, one of the first LED chip 200 or the second LED chip 400 emits blue light, the other emits yellow light, and the phosphor 700 emits green light.

In yet another embodiment, the phosphor 700 is coated on third LED chip 600 of FIG. 4A. Thus, a white light is generated by mixing three LED chips 200, 400, and 600 and the phosphor 700. Note that the monochromatic color lights emitted by the LED chips or the phosphor are not limited to the above descriptions; thus, those skilled in the art may adjust the colors of the LED chips or phosphor according to actual application needs.

The invention provides a light emitting semiconductor structure in which at least two LED chips are vertically stacked. Compared with the LED chips arranged in the same plane, the semiconductor structure of the invention has a smaller package size. Thus, in sequential steps, a secondary optical lens may be easily designed. Additionally, several monochromatic colors emitted by the LED chips are mixed to generate and to improve the color rendering index (CRI) of the semiconductor structure of the invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting semiconductor structure, comprising:
a substrate;
a first LED chip formed on the substrate;
an adhesion layer formed on the first LED chip; and
a plurality of second LED chips formed on the adhesion layer, wherein the second LED chips have a first conductive wire which is electrically connected to the substrate, and wherein the adhesion layer exposes a portion of the first LED chip, and wherein the first LED chip has a first surface contacting the adhesion layer, each of the second LED chips has a second surface contacting the adhesion layer, and the first surface is insulated from the second surfaces.

2. The light emitting semiconductor structure as claimed in claim 1, wherein the first LED chip comprises a first pad and a second pad which are electrically connected to the substrate.

3. The light emitting semiconductor structure as claimed in claim 1, wherein the first LED chip has a second conductive wire which is electrically connected to the substrate.

4. The light emitting semiconductor structure as claimed in claim 1, wherein one of the first LED chip and the second LED chips emits blue light, and the other emits yellow light.

5. The light emitting semiconductor structure as claimed in claim 1, wherein the first LED chip and the plurality of second LED chips emit two different colors of light.

6. The light emitting semiconductor structure as claimed in claim 1, wherein a size of the plurality of second LED chips is smaller than a size of the first LED chip.

7. The light emitting semiconductor structure as claimed in claim 1, wherein the plurality of second LED chips is arranged in circular, triangular, rectangular or irregular shapes.

* * * * *